United States Patent [19]

Taylor

[11] Patent Number: 4,970,471
[45] Date of Patent: Nov. 13, 1990

[54] GALLIUM ARSENIDE CLASS AB OUTPUT STAGE

[75] Inventor: Stewart S. Taylor, Beaverton, Oreg.

[73] Assignee: Triquint Semiconductor

[21] Appl. No.: 317,420

[22] Filed: Feb. 28, 1989

[51] Int. Cl.⁵ .............................................. H03F 3/16
[52] U.S. Cl. .................... 330/253; 330/277; 330/296
[58] Field of Search ............... 330/253, 255, 261, 264, 330/267, 269, 273, 277, 296, 301

[56] References Cited

U.S. PATENT DOCUMENTS 4,284,957  8/1981  Hague ............................. 330/255 X
4,439,974  3/1984  Schwarz et al. ................. 330/273 X
4,616,189  10/1986  Pengue, Jr. ......................... 330/253

FOREIGN PATENT DOCUMENTS 0145912  7/1986  Japan ................................... 330/264

Primary Examiner—Steven Mottola

[57] ABSTRACT

A class AB amplifier output circuit having two output devices is implemented using single polarity GaAs devices. The exemplified circuit comprises a bias control loop that includes the gate-to-source voltage of one of the output devices, the gate-to-source voltage of a device that the replicates the gate-to-source voltage of the other output device, and a pair of diodes. The configuration of the control loop is such that the bias current in the two output devices is controlled and set to approximately one quarter of $I_{DSS}$. The output circuit has a differential input that may be coupled to the output of a preamplifier circuit in a conventional manner.

12 Claims, 1 Drawing Sheet

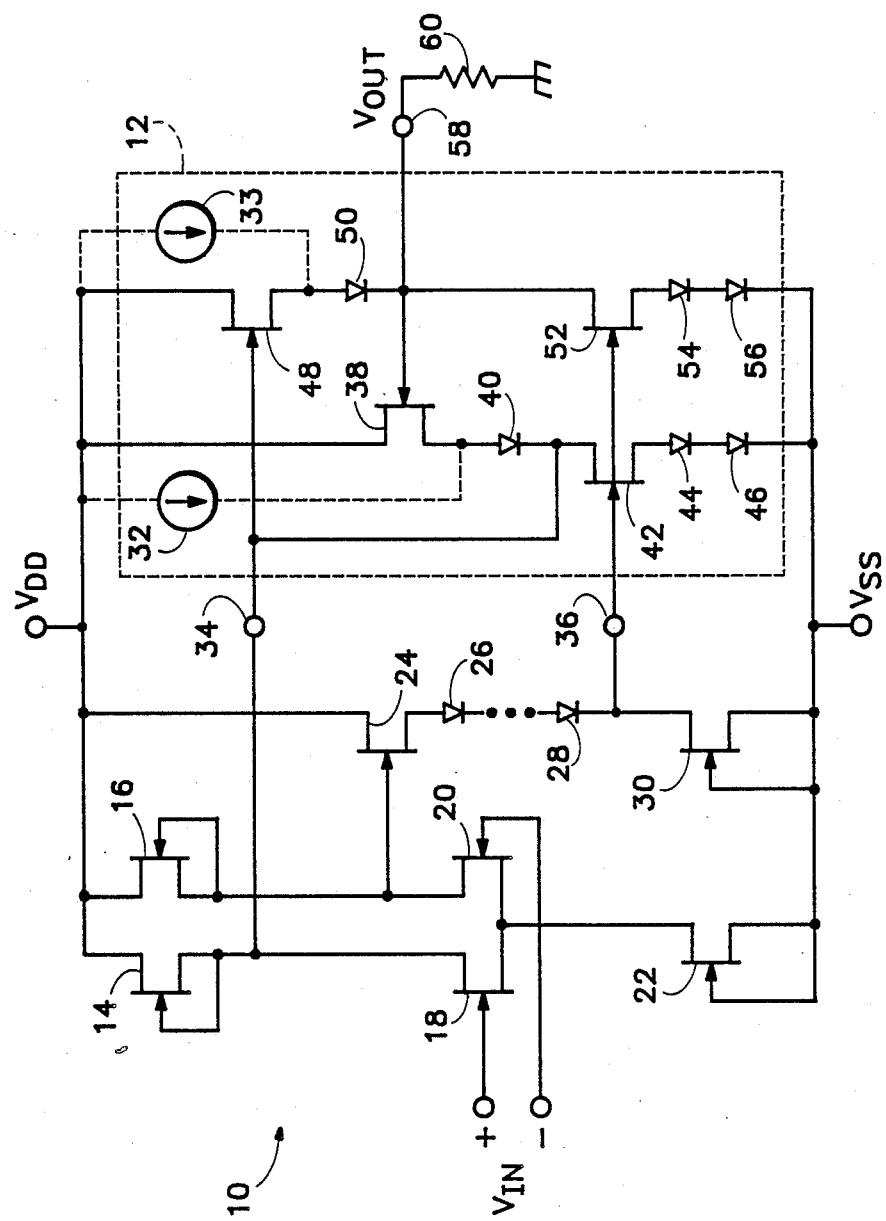

GALLIUM ARSENIDE CLASS AB OUTPUT STAGE

BACKGROUND OF THE INVENTION

The present invention relates generally to amplifier output circuits, and in particular to amplifier output circuits fabricated using gallium arsenide (GaAs) field-effect transistors. More particularly, the invention addresses the challenge of implementing a linear, wide band Class AB amplifier with a controllable operating point using single polarity GaAs FET devices.

Known amplifier output circuits include linear class A amplifiers and nonlinear "totem pole" circuits. Class A amplifiers are inefficient and must dissipate large amounts of power, while totem pole circuits have substantially different gains for positive and negative output voltages and are difficult to compensate within a feedback loop. In addition, some forms of totem pole circuits do not provide a means for controlling the bias current in the output devices.

Another class of known output circuits does include a control mechanism to establish the bias current in the output devices. These circuits fall into three categories: One includes designs that provide an adequate control of the bias current in the output devices, but which require the use of both n-channel and p-channel devices. Circuits of the second category are designed with single polarity devices, but the control of the output bias current is poor because, typically, a control voltage affects only one of the output devices. The third category of such circuits provides adequate bias current control, but at the expense of severely limited output drive capability and wasted power.

Accordingly, a general objective of the present invention is to overcome these and other drawbacks of known amplifier output circuits by providing a class AB output circuit fabricated with single polarity GaAs devices, wherein the bias current in both output devices is controlled, the positive and negative gains are similar, and cross-over distortion is minimized while maintaining adequate output drive capability.

SUMMARY OF THE INVENTION

According to the present invention, a class AB amplifier output circuit is provided that includes a pair of single polarity, GaAs output devices. In a preferred embodiment of the amplifier circuit, a control loop is implemented using the gate-to-source voltage of one of the pair of output devices, the gate-to-source voltage of a device that replicates the gate-to-source voltage of the other output device, and multiple diodes used to provide a bias voltage. The configuration of the control loop is such that the bias current in the two output devices is controlled and set to a predetermined fraction of the maximum available current. The amplifier circuit includes a differential input that may be coupled to the differential output of a preamplifier stage.

BRIEF DESCRIPTION OF THE DRAWING

The sole figure of the drawing is a schematic diagram of an exemplary amplifier incorporating a Class AB GaAs output circuit according to the present invention.

DESCRIPTION OF PREFERRED EMBODIMENT

Referring now to the drawing, an amplifier 10 is shown to include an output circuit 12 according to the present invention.

Amplifier 10 includes a preamplifier stage comprising a pair of input field-effect transistors 18 and 20. The source electrodes of FETs 18 and 20 are connected together and coupled to the drain of a FET 22, which provides a bias current to the input transistors. The gate and source of FET 22 are both connected to $V_{SS}$ to produce a bias current of $I_{DSS}$. The drains of input transistors 18 and 20 are coupled to FETs 14 and 16, both of which are configured as current sources, as shown, and function as active loads for the input transistors. The differential output voltage of the preamplifier stage is, therefore, the voltage difference between the drains of FETs 18 and 20. The voltage output at the drain of FET 20 may be level-shifted by an optional source follower transistor 24 and diodes 26 . . . 28. As indicated in the figure, additional diodes may be added in series depending on the value of the supply voltages $V_{DD}$ and $V_{SS}$ and other design considerations. In general, a sufficient number of diodes is provided to maintain FET 24 in a saturated condition. An FET 30, configured as a current source, provides bias current for the level shifter, as shown. It will be understood that the preamplifier and level shifter depicted in the drawing as part of amplifier 10 exemplify only one of many possible arrangements that may be used to provide a differential input signal to output circuit 12.

Output circuit 12 comprises a pair of input terminals 34 and 36, which couple a differential input signal directly to the gates of GaAs output transistors 48 and 52, respectively. The source of output FET 48 is coupled through a diode 50 to the drain of transistor 52. Output current from amplifier 12 is delivered to an external load, represented in the drawing by a resistor 60, through an output terminal 58 connected to the drain of transistor 52 as shown. Transistors 48 and 52 generally are of the same size.

To control the bias current through the output devices, a control loop is provided that includes the gate-to-source voltage of output FET 48 and the gate-to-source voltage of output FET 52. Since transistors 48 and 52 are of the same polarity, however, it is difficult to form a control loop directly using the gate-to-source voltages of both devices. Therefore, according to the invention, the gate-to-source voltage of transistor 52 is replicated and incorporated into a loop containing the gate-to-source voltage of FET 48.

The replication mechanism includes a pair of FETs, 38 and 42, and diodes 44, 46, 54, and 56. The drain of FET 38 is connected to the $V_{DD}$ supply and its gate is coupled to output terminal 58 and the drain of output transistor 52, as shown. The source of FET 38 is coupled by a diode 40 to the drain of FET 42, the gate of which is coupled directly to the gate of output FET 52. The drain of transistor 42 is coupled to input terminal 34. The sources of FETs 42 and 52 are connected to the $V_{SS}$ supply by respective pairs of diodes 44, 46 and 54, 56, as shown. Diodes 44, 46, 54, and 56 are used to provide sufficient bias voltage for current source transistor 30, and may be changed or eliminated depending upon the voltage compliance requirements of the circuit used to drive input terminal 36.

Transistors 42 and 52 have the same gate-to-source voltage, since the number of diodes between the source and the supply voltage for each transistor is the same and the areas of diodes 44, 46, 54, and 56 are scaled. The drain current of transistor 42 thus is a scaled replica of the drain current of FET 52. The drain current of FET 42 passes through FET 38, which is suitably chosen to be of the same size as transistor 42. In this manner, the gate-to-source voltage of transistor 52 is replicated by the gate-to-source voltage of transistor 38. If transistors 42 and 38 have the same width-to-length (W/L) ratio, then:

$$V_{GS}(52) = V_{GS}(42) = V_{GS}(38) \quad [1]$$

By thus replicating the gate-to-source voltage of FET 52, a control loop may be formed that includes the gate-to-source voltage of FET 48. This control loop includes a bias voltage, which is provided by diodes 40 and 50, to control the bias current of the output transistors. The entire control loop includes FETs 48 and 38, and diodes 40 and 50. The voltage equation for the loop is:

$$V_{GS}(48) + V_D(50) + V_{GS}(38) + V_D(40) = 0 \quad [2]$$

Assuming that $V_D(40) = V_D(50) = V_D$, and substituting and rearranging terms, the following equation results:

$$V_{GS}(48) + V_{GS}(52) = -2V_D \quad [3]$$

If the output voltage is zero, then the drain currents of GaAs FETs 48 and 52 will be the same and the gate-to-source voltage of both transistors will be approximately −0.7 volts. Since FETs 48 and 52 in the exemplified embodiment are depletion mode GaAs field-effect transistors with a pinchoff voltage of −1.5 volts, they will be properly biased with drain currents of approximately $I_{DSS}(48)$ divided by four. Equation [3] shows that transistors 48 and 52 are correctly biased. However, equation [3] also shows that as one of the two output devices conducts more, the other must conduct less, which ensures a smooth Class AB action without cross-over distortion.

It should be noted that the gate-to-source bias voltage, $-2V_D$, can be increased or decreased by the appropriate substitution of more or fewer diodes, or by other means, which would result in a different quiescent current flowing through output transistors 48 and 52. The correct bias voltage to be applied depends on the pinchoff voltage of the particular GaAs FET devices that are used in the circuit. If desired, the size of transistor 42 may be varied relative to the size of transistor 52. For example, the width of FET 52 may be from four to ten times greater than the width of FET 42. This can be done to decrease power dissipation in output circuit 12. If the size of transistor 42 is decreased, it is desirable also to decrease the size of transistor 38 and diodes 40, 44, and 46 in a similar fashion, in order to obtain optimum performance in accordance with equations [2] and [3].

It should be noted that the bias voltage provided by diodes 40 and 50 may be repositioned around the bias loop. In addition, current sources 32 and 33 (shown in phantom outline in the drawing) optionally may be provided to maintain a relatively constant voltage across diodes 40 and 50, respectively, and thereby maintain smooth class AB operation.

It should be further noted that output circuit 12 is driven differentially through input terminals 34 and 36. The gain from each input terminal to output terminal 58 is approximately equal. In this way, the Class AB action of the output stage is further enhanced and cross-over distortion is minimized.

As will now be apparent, an improved Class AB GaAs amplifier output circuit has been described that uses a pair of single polarity semiconductor devices and in which the quiescent output current of both output devices is tightly controlled to ensure smooth Class AB operation.

Although the invention has been described and illustrated in detail, it is clearly understood that the same is by way of example and illustration only and is not to be taken by way of limitation. For example, the illustrated preamplifier and level shifter may be of another form, and output circuit 12 may be driven by other circuits capable of providing differential output signals. Further, although the circuit illustrated in the drawing employs n-channel devices, it will be appreciated by those skilled in the art that an equivalent circuit may be constructed using p-channel devices. The scope of the present invention is therefore limited only by the terms of the appended claims.

I claim:

1. A class AB amplifier output circuit having a positive input, a negative input, and an output comprising
   (a) a first field-effect transistor having a source, a drain, and a gate forming the positive input, the drain being coupled to a first source of supply voltage,
   (b) a second field-effect transistor having a source, a drain, and a gate forming the negative input, the drain of said second transistor being coupled to the source of said first transistor to form the output, and the source of said second transistor being coupled to a second source of supply voltage,
   (c) means for providing a bias voltage in series relation with the gate-to-source voltage of said first transistor, and
   (d) means for replicating the gate-to-source voltage of said second transistor in series relation with said bias voltage means and the gate-to-source voltage of said first transistor to form a bias control loop.

2. The circuit of claim 1, wherein said bias voltage means comprises first and second terminals, the first terminal being coupled to the source of said first transistor and the second terminal being coupled to said output.

3. The circuit of claim 1, wherein said bias voltage means comprises first and second terminals, the first terminal being coupled to the positive input and the replicated gate-to-source voltage of said second transistor being coupled between the output and the second terminal of said second bias voltage means.

4. The circuit of claim 1, wherein said replicating means comprises
   (a) a third transistor having a source coupled to the second source of supply voltage, a drain coupled to the positive input, and a gate coupled to the negative input, and
   (b) a fourth transistor having a drain coupled to said first source of supply voltage, a gate coupled to the output, and a source being coupled to the drain of said third transistor.

5. The circuit of claim 4, wherein the width of said second transistor is from four to ten times larger than the width of said third transistor.

6. The circuit of claim 1, wherein said first and second transistors are gallium arsenide devices.

7. A GaAs class AB amplifier output circuit having a positive input, a negative input, and an output comprising
   (a) a first transistor having a source, a drain, and a gate forming the positive input, the drain of said first transistor being coupled to a first source of supply voltage, (b) first bias voltage means having first and second terminals, the first terminal being coupled to the source of said first transistor, the second terminal being coupled to the output of said circuit, (c) a second transistor having a source, drain, and a gate forming the negative input, the drain of said second transistor being coupled to the output of said circuit, and the source being coupled to a second source of supply voltage, (d) second bias voltage means having first and second terminals, the first terminal being coupled to the positive input of said circuit, and (e) means for replicating the gate-to-source voltage of said second transistor between the output of said circuit and second terminal of said second bias voltage means.

8. The circuit of claim 7, wherein the replicating means comprises (a) a third transistor having a source coupled to the second source of supply voltage, a drain coupled to the positive input of said circuit, and a gate coupled to the negative input of the circuit, and (b) a fourth transistor having a source coupled to the second terminal of said second bias means, a drain coupled to said first source of supply voltage, and a gate coupled to the output of said circuit.

9. The circuit of claim 8, wherein the width of said second transistor is from four to ten times greater than the width of said third transistor.

10. The circuit of claim 7, further comprising a current source for supplying current to the first terminal of said first bias voltage means.

11. The circuit of claim 7, further comprising a current source for supplying current to the second terminal of said second bias voltage means.

12. The circuit of claim 10, further comprising a current source for supplying current to the second terminal of said second bias voltage means.

* * * * *